United States Patent [19]
Cava et al.

[11] Patent Number: 5,473,456
[45] Date of Patent: Dec. 5, 1995

[54] METHOD FOR GROWING TRANSPARENT CONDUCTIVE GALLIUM-INDIUM-OXIDE FILMS BY SPUTTERING

[75] Inventors: Robert J. Cava, Bridgewater; Jueinai R. Kwo, Watchung; Gordon A. Thomas, Princeton, all of N.J.

[73] Assignee: AT&T Corp., Murray Hill, N.J.

[21] Appl. No.: 143,806

[22] Filed: Oct. 27, 1993

[51] Int. Cl.$^6$ .......................... G02F 1/1343; H01L 23/48
[52] U.S. Cl. ........................................ 359/87; 204/192.29
[58] Field of Search ........................ 359/87; 204/192.15, 204/192.26, 192.29

[56] References Cited

U.S. PATENT DOCUMENTS

| | | | |
|---|---|---|---|
| 3,607,699 | 9/1971 | Sosniak | 204/192 |
| 4,187,336 | 2/1980 | Gordon | 428/34 |
| 4,842,705 | 6/1989 | Mueller | 204/192.29 |
| 5,006,213 | 4/1991 | Sichmann et al. | 204/192.14 |
| 5,011,585 | 4/1991 | Brochot et al. | 204/192.13 |
| 5,070,379 | 12/1991 | Nomoto et al. | 357/23.7 |
| 5,135,581 | 8/1992 | Tran et al. | 136/256 |
| 5,207,885 | 5/1993 | Seiler | 204/298.13 |

FOREIGN PATENT DOCUMENTS

| | | | |
|---|---|---|---|
| 1-225315 | 9/1989 | Japan | 204/192.15 |
| 2095703 | 10/1982 | United Kingdom | 204/192.29 |

OTHER PUBLICATIONS

G. Haacke, "Transparent Conducting Coatings", FIAnn. Rev. Mater. Sci., pp. 73–93 (1977).
C. G. Granqvist, "Solar Energy Materials: Overview and Some Examples" Appl. Phys. A., vol. 52, pp. 83–93 (1991).
J. P. Zheng et al. "Low resistivity indium tin oxide by pulsed laser deposition" Appl. Phys. Lett., vol. 63 p. 1 (1993).

Primary Examiner—Anita Pellman Gross
Assistant Examiner—Charles Miller
Attorney, Agent, or Firm—Glen E. Books

[57] ABSTRACT

Applicants have discovered that films of conductively doped GaInO$_3$ grown on substrates by sputter deposition have conductivity comparable to conventional wide band-gap transparent conductors while exhibiting superior light transmission, particularly in the green and blue wavelength regions of the visible spectrum. Substrate temperatures ranged from 100° C. to 550° C. in an argon-oxygen ambient of total pressure 4 mTorr to 20 mTorr with an optimal oxygen partial pressure in the range 0.5 to 2 mTorr.

9 Claims, 2 Drawing Sheets

ON-AXIS SPUTTERING

ON-AXIS SPUTTERING

METHOD FOR GROWING TRANSPARENT CONDUCTIVE GALLIUM-INDIUM-OXIDE FILMS BY SPUTTERING

FIELD OF THE INVENTION

The present invention relates to methods for growing conductive films and, in particular, to a method for growing a transparent conductive film comprising $GaInO_3$.

BACKGROUND OF THE INVENTION

A new transparent conductive material comprising conductively doped $GaInO_3$ is disclosed in the concurrently filed application of Robert J. Cava entitled "Transparent Conductors Comprising Gallium-Indium-Oxide" Ser. No. 08/143,811 filed Oct. 27, 1993 and issued as U.S. Pat. No. 5,407,602 on Apr. 18, 1995 which is incorporated herein by reference. Specifically, $GaInO_3$ can be doped with aliovalent elements having valence greater than 3 to achieve resistivities of less than 10 milliohm-cm. This material in bulk form exhibits conductivity comparable to conventional wide band-gap transparent conductors while exhibiting superior light transmission, particularly in the blue wavelength region of the visible spectrum. Preferred forms of the material are $GaIn_{1-x}M_xO_3$ or $Ga_{1-y}InM_yO_3$ where $0.005 \leq x, y \leq 0.12$. Preferred dopants (M) are Sn, Si, Ge, Ti or combinations thereof.

While the bulk material exhibits highly promising qualities, the primary use of transparent conductive materials is as coatings on transparent substrates such as glass, fused silica and semiconductors. The present invention is directed to methods for coating this material on such substrates in such a fashion as to retain its conductivity and superior light transmission qualities. It also pertains to the resulting products.

SUMMARY OF THE INVENTION

Applicants have discovered that films of conductively doped $GaInO_3$ grown on substrates by sputter deposition have conductivity comparable to conventional wide band-gap transparent conductors while exhibiting superior light transmission, particularly in the green and blue wavelength regions of the visible spectrum. Substrate temperatures ranged from 100° C. to 550° C. in an argon-oxygen ambient of total pressure 4 mTorr to 20 mTorr with an optimal oxygen partial pressure in the range 0.5 to 2 mTorr.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the graph, are not to scale.

DETAILED DESCRIPTION

Figure 1:
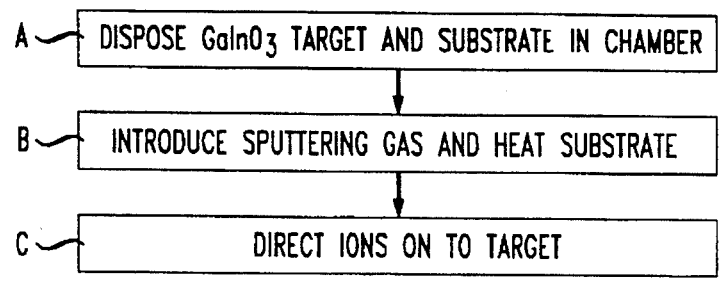
FIG. 1 is a block diagram showing the steps in sputtering a transparent film of conductively doped $GaInO_3$ on a substrate.

Referring to the drawings, FIG. 1 is a block diagram showing the steps in sputtering a transparent film of conductively doped $GaInO_3$ on a substrate. As preliminary steps, a target of conductively doped $GaInO_3$ is provided as well as a substrate onto which the film is to be grown. The substrate can be glass, fused silica, plastic or a semiconductor such as monocrystalline silicon. The target is conveniently a 1" diameter, ⅛" thick pellet of $Ga_{1-x}Ge_xIn_{1-y}Sn_yO_3$, prepared by solid state reaction as described in the aforementioned application to R. J. Cava.

An exemplary suitable target can be prepared as follows. Powdered gallium oxide, $Ga_2O_3$, indium oxide, $In_2O_3$, and tin oxide, $SnO_2$, are weighed out to yield the appropriate mole ratios for $GaIn_{1-x}Sn_xO_3$. For instance, for a 5-gram total weight sample of $GaIn_{0.94}Sn_{0.06}O_3$, 2.0090 grams of $Ga_2O_3$, 2.7972 grams of $In_2O_3$ and 0.1938 grams of $SnO_2$ are used. The powders are mixed together and ground together in a mechanical mortar and pestle for a minimum of five minutes to insure good mixing and contact of powder particles. The mixed powders are transferred into high density aluminum oxide crucibles with cover and heated in air for an initial period of 12–15 hours at temperatures between 1100° and 1200° C. in air. The resulting powders are then ground mechanically again, re-introduced into the covered aluminum oxide crucibles, and heated for a period of 12–15 hours at 1300° C. in air. After a third grinding, pellets are pressed in a standard steel dye (typically to a load of 3000 pounds for a half-inch diameter pellet). The pellets are then heated again at 1300° C. in air for a period of up to 60 hours. Pellets are typically placed on powder of their own composition inside the covered aluminum oxide crucibles for the pellet firing step. The pellets are cooled after this heating step at the natural cooling rate of the furnace, which in our case results in reaching 300° C. in approximately three hours, at which point the pellets are removed from the furnace. The resulting pellets are typically single phase materials (to the detectability limits of standard powder x-ray diffraction) of the $GaInO_3$ structure type. Air is selected as an ambient for the initial processing steps because of its convenience. Covers are placed over the crucibles as a precaution to prevent evaporation of the oxides, but we have not observed evaporation under the conditions described. The first air firing need not necessarily be in the 1100°–1200° C. range, but we select an initial low temperature to reduce the possibility of metastable melting. The final heating temperature of 1300° C. in air gave more satisfactory conductivities, in one set of experiments, than did a 1400° C. air treatment. The times and temperatures of these treatments are expected to be dependent on the reactivities of the starting materials and the efficiencies of the grinding operations. Shorter times can be expected to give equally satisfactory results in the preparation of ceramic targets for sputtering or laser ablation.

Alternatively, for applications which do not require the highest conductivity, pellets of undoped $GaInO_3$ after firing can be heated in a reducing ambient (e.g. nitrogen-hydrogen (15 mole percent hydrogen) at 600°–650° C.). Such targets produce conductive films. It is believed that they are effectively doped by oxygen vacancies.

Figure 2:
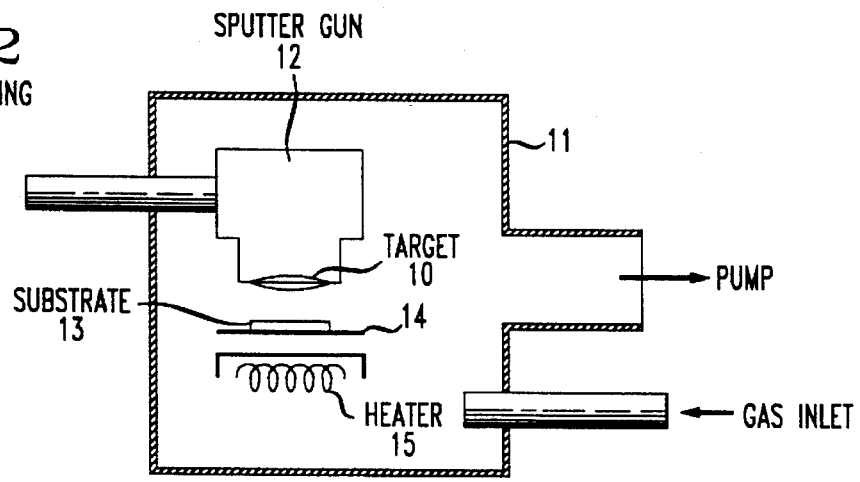
FIGS. 2 and 3 are schematic views of apparatus useful in practicing the process of FIG. 1.
Figure 3:
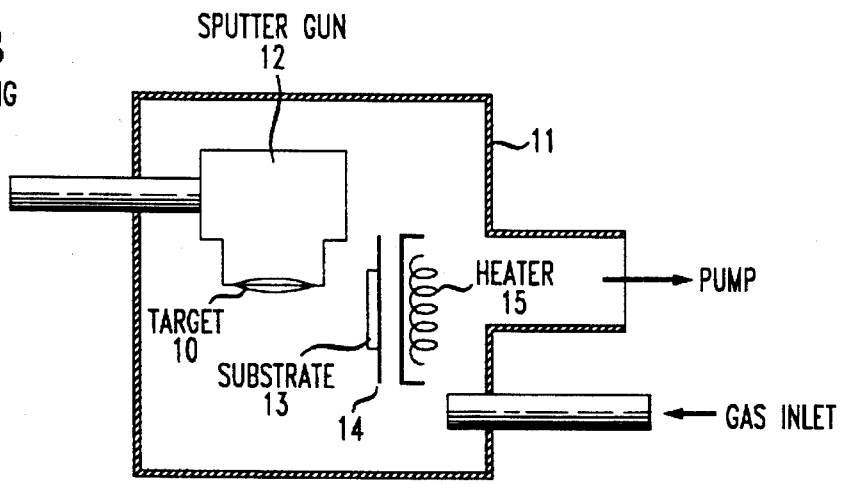

The first step shown in block A of FIG. 1 is to dispose the target of conductively doped GaInO₃ and the substrate in an evacuable chamber. As shown in FIG. 2, the GaInO₃ target 10 is mounted in chamber 11 for receiving ion bombardment as from a sputter gun 12. In on-axis sputtering illustrated in FIG. 2, the substrate 13 is disposed on a holder 14 adjacent a heating element 15 for permitting control of substrate temperature directly underneath the target. In the alternative off-axis sputtering illustrated in FIG. 3, the substrate 13 is oriented 90° to the sputtering axis and placed outside the plasma plume, approximately 0.5–2.0 cm from the edge of the sputtering gun. The on-axis approach permits faster growth, but the off-axis approach permits tighter control stoichiometry and better crystalinity by avoiding bombardment of the substrate with negative oxygen ions.

The next step shown in block B of FIG. 1 is to immerse the substrate in an approximate sputtering gas and to heat the substrate to a desired temperature in the range 100° C. to 550° C. The preferred sputtering gas is a mixture of inert gas, such as argon, with a low concentration of oxygen. The total pressure is preferably in the range 4 mTorr to 20 mTorr and the oxygen partial pressure is in the range 0.1 mTorr to 10 mTorr and preferably 0.5 mTorr to 2 mTorr. A typical oxygen to argon ratio is 1:15.

As a preliminary step, the chamber is first evacuated to a low base pressure on the order of $10^{-7}$ Torr, and then the sputtering gas is bled into the chamber. The substrate is then heated to the desired temperature, preferably in the range 250° C. to 500° C.

The third step shown in block C of FIG. 1 is to direct ions onto the target to sputter material from the target onto the substrate. Using as a sputter gun a 1" magnetron source commercially available from U.S. Inc., the source operating at a dc voltage of 350 V, a current of 0.78A and a power level of 25 Watts produced a growth rate of 1.3 µm/hr in the on-axis geometry and 0.5 µm/hr in the off-axis geometry.

After growth, the chamber can again be evacuated, and the coated substrate can be permitted to cool to room temperature. The films emerge from the chamber transparent to the eye and with good electrical conductivity. Films have been obtained with resistivity as low as 2.5 milliohm-cm for a 0.4 micrometer film.

Figure 4:
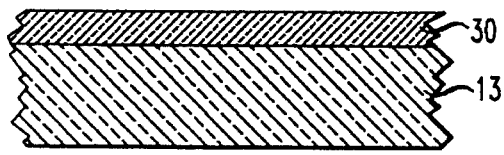
FIG. 4 is a cross section of a product made by the process of FIG. 1.

FIG. 4 is a cross section of the product made by the process of FIG. 1, showing a thin film 30 of polycrystalline, transparent conductive GaInO₃ on a transparent substrate 13. The film preferably has a thickness in the range 0.1 µm to 10 µm.

Figure 5:
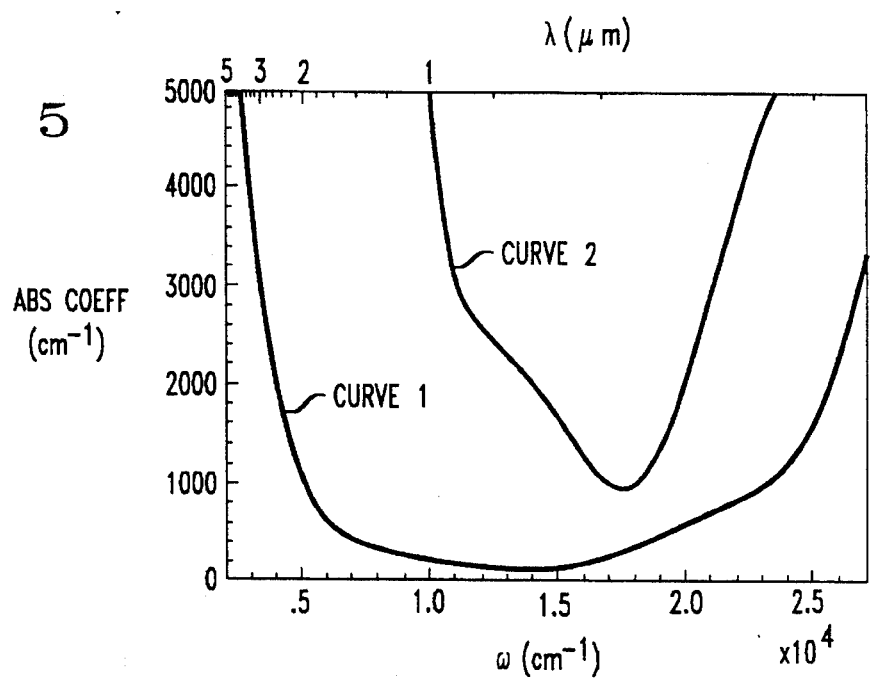
FIG. 5 is a graphical display of absorption versus wavelength for a typical film made in accordance with the process of FIG. 1.

FIG. 5 is a graphical display of the absorption spectrum of a typical film made in accordance with the process of FIG. 1 (curve 1) as compared to the absorption spectrum of conventional InSnO₃ (curve 2). The transmission is superior to indium tin oxide throughout the visible spectrum and especially in the green and blue wavelength regions.

Figure 6:
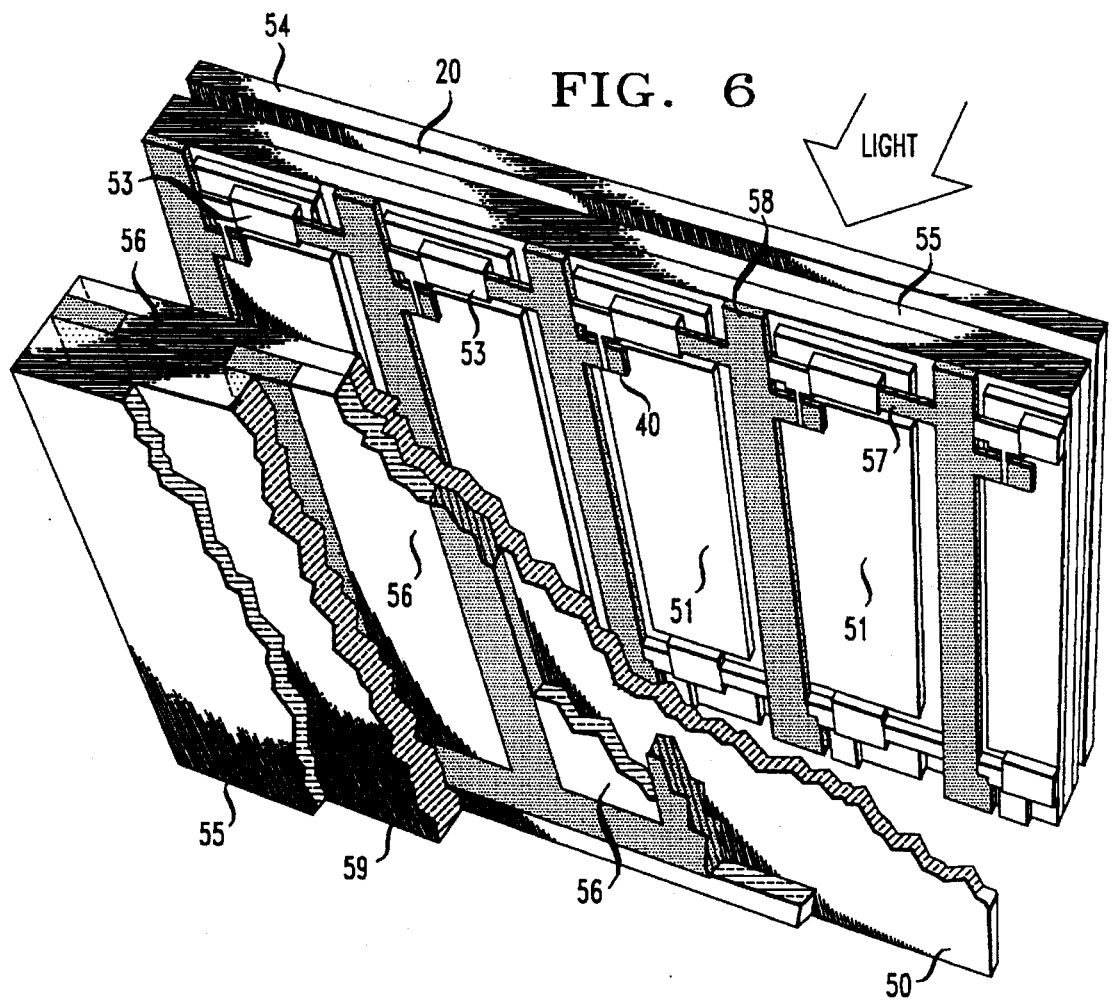
FIG. 6 shows the use of conductively doped $GaInO_3$ electrodes in a liquid crystal display device.

One important use of GaInO₃ coated substrates is in liquid crystal display devices where electrodes comprising conductively doped GaInO₃ provide enhanced transparency, particularly in the visible blue region. FIG. 6, which is a schematic rendering of a portion of an active matrix liquid crystal display device (AMLCD), shows how the product of FIG. 4 can be used to make an improved flat display. In essence the AMLCD comprises a liquid crystal medium (not shown) disposed between a transparent common electrode 50 and an array of transistors 51 and local electrodes 52 (preferably pixel-size) disposed on a common substrate 30. Each local electrode is switched by an associated transistor 51 interconnected to an associated storage capacitor 53. The transistors 51 thereby control the state of the voltage on each local electrode 52 and, in accordance with well known principles, control the optical state of a pixel-size liquid crystal region.

In accordance with conventional structure, the AMLCD includes a back light (not shown), a diffuser 54, polarizers 55 and a grid of color filter layers 56 disposed on a transparent substrate 59. Rows of transistor gates can be interconnected via conductive gate lines 57 and columns of transistor sources can be interconnected via conductive data lines 58 for switchable control of individual pixels.

The AMLCD of FIG. 6 is of conventional construction except that the transparent electrodes comprise conductively doped GaInO₃ coated on glass substrates as shown in FIG. 4. Preferably the electrodes are $GaIn_{1-x}Sn_xO_3$ or $Ga_{1-x}Ge_xInO_3$. The advantage of using the inventive transparent conducting material in this AMLCD include enhanced transparency and more realistic color display, especially in the blue portion of the visible spectrum.

It is to be understood that the above-described embodiments are illustrative of only a few of the many possible specific embodiments which can represent applications of the invention. Numerous and varied other an arrangements can be made by those skilled in the art without departing from the spirit and scope of the invention.

We claim:

1. A method for coating a substrate with a transparent, conductive layer comprising GaInO₃ comprising the steps of:

disposing a target comprising GaInO₃ and a substrate to be coated in a low pressure ambient having a partial pressure of oxygen in the range 0.1 mTorr to 10 mTorr;

heating the substrate to a temperature in the range 100° C. to 550° C.; and bombarding said target with ions for sputtering material from said target onto said substrate.

2. The method of claim 1 wherein said target comprises GaInO₃ doped with an aliovalent material having a valence greater than 3 to a resistivity less than 10 milliohm-cm.

3. The method of claim 1 wherein said low pressure ambient comprises a mixture of inert gas and oxygen having a total pressure in the range 4 mTorr to 20 mTorr.

4. The method of claim 1 wherein said substrate is heated to a temperature in the range 250° C. to 500° C.

5. The method of claim 1 wherein said target is undoped GaInO₃ deficient in oxygen.

6. In a liquid crystal display device of the type comprising a pair of electrodes, a liquid crystal medium disposed between said pair of electrodes and means for applying a voltage between said electrodes, the improvement wherein:

at least one of said electrodes comprises a transparent, conductive layer comprising GaInO₃.

7. The improved liquid crystal display of claim 6 wherein said GaInO₃ is doped with an aliovalent material having a valence greater than 3.

8. The improved liquid crystal display of claim 6 wherein said GaInO₃ is doped with tin, germanium, silicon, titanium or a combination thereof.

9. The improved liquid crystal display of claim 6 wherein said GaInO₃ is undoped GaInO₃ deficient in oxygen.

\* \* \* \* \*